(12) United States Patent
Miller et al.

(10) Patent No.: US 9,941,178 B2
(45) Date of Patent: Apr. 10, 2018

(54) METHODS FOR DETECTING ENDPOINT FOR THROUGH-SILICON VIA REVEAL APPLICATIONS

(71) Applicant: Lam Research Corporation, Fremont, CA (US)

(72) Inventors: Alan Jeffrey Miller, Moraga, CA (US); Evelio Sevillano, Fremont, CA (US); Jorge Luque, Fremont, CA (US); Andrew D. Bailey, III, Pleasanton, CA (US); Qing Xu, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/353,305

(22) Filed: Nov. 16, 2016

(65) Prior Publication Data
US 2017/0062290 A1     Mar. 2, 2017

Related U.S. Application Data

(62) Division of application No. 14/265,275, filed on Apr. 29, 2014, now Pat. No. 9,543,225.

(51) Int. Cl.
*H01L 21/00*     (2006.01)
*H01L 21/66*     (2006.01)
*H01L 21/3065*   (2006.01)
*H01L 21/67*     (2006.01)
*H01L 21/768*    (2006.01)

(52) U.S. Cl.
CPC ......... *H01L 22/26* (2013.01); *H01L 21/3065* (2013.01); *H01L 21/67253* (2013.01); *H01L 21/76898* (2013.01); *H01L 22/12* (2013.01)

(58) Field of Classification Search
CPC .................................................. H01L 21/3065
USPC .......................................................... 438/14
See application file for complete search history.

(56) References Cited

U.S. PATENT DOCUMENTS

| 6,332,660 | B1 * | 12/2001 | Salice ................... | E05D 15/262 |
| | | | | 160/207 |
| 6,400,458 | B1 * | 6/2002 | Howald ................ | B24B 37/013 |
| | | | | 257/E21.528 |
| 2005/0020073 | A1 * | 1/2005 | Perry ................... | G01N 21/272 |
| | | | | 438/689 |

(Continued)

*Primary Examiner* — Matthew Landau
*Assistant Examiner* — Igwe U Anya
(74) *Attorney, Agent, or Firm* — Martine Penilla Group, LLP

(57) ABSTRACT

Systems and methods for processing a semiconductor wafer includes a plasma processing chamber. The plasma processing chamber includes an exterior, an interior region with a wafer receiving mechanism and a viewport disposed on a sidewall of the plasma processing chamber providing visual access from the exterior to the wafer received on the wafer receiving mechanism. A camera is mounted to the viewport of the plasma processing chamber on the exterior and coupled to an image processor. The image processor includes pattern recognition logic to match images of emerging pattern captured and transmitted by the camera, to a reference pattern and to generate signal defining an endpoint when a match is detected. A system process controller coupled to the image processor and the plasma processing chamber receives the signal from the image processor and adjusts controls of one or more resources to stop the etching operation.

16 Claims, 11 Drawing Sheets

(56) References Cited

U.S. PATENT DOCUMENTS

2008/0138993 A1\* 6/2008 Hiroshima ............ H01J 37/321
  438/714
2013/0137195 A1\* 5/2013 Ansell .................... H01L 22/26
  438/9

\* cited by examiner

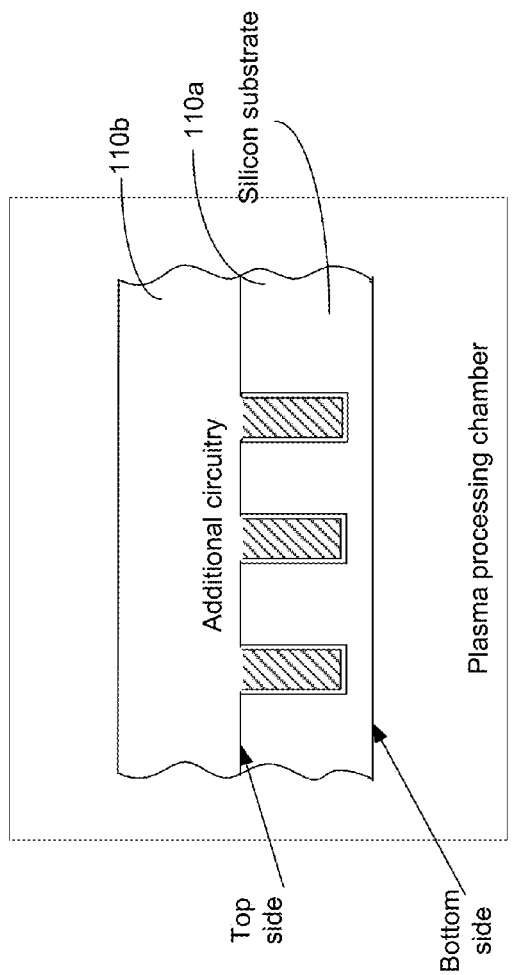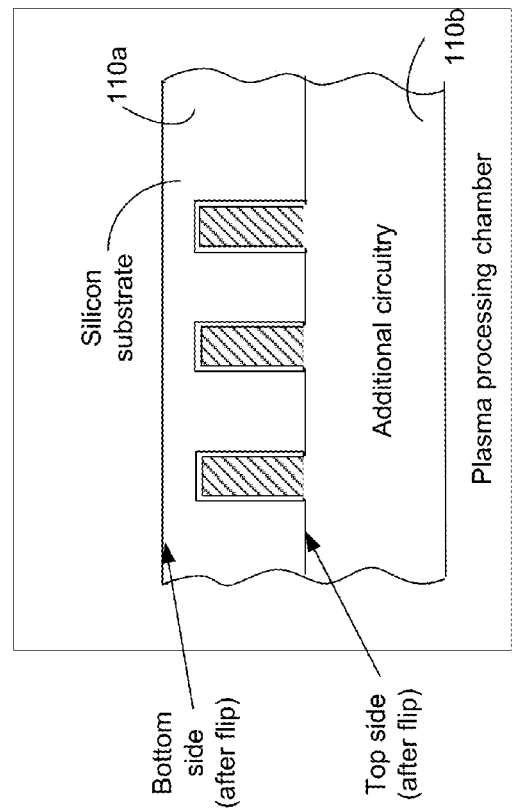

Imaging Endpoint Feasibility for TSV Reveal Application
Prior to Endpoint:
Bare Si Surface, no discernable features
After Endpoint:
Via Pattern clearly visible
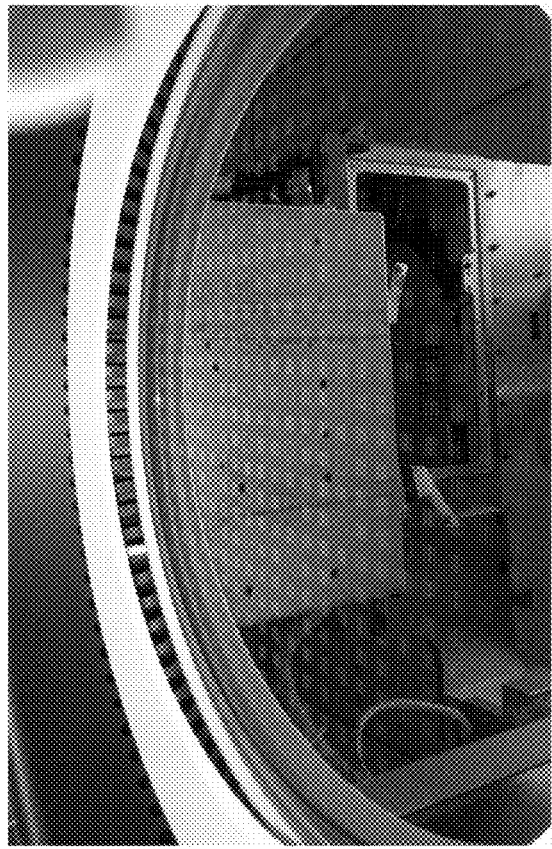
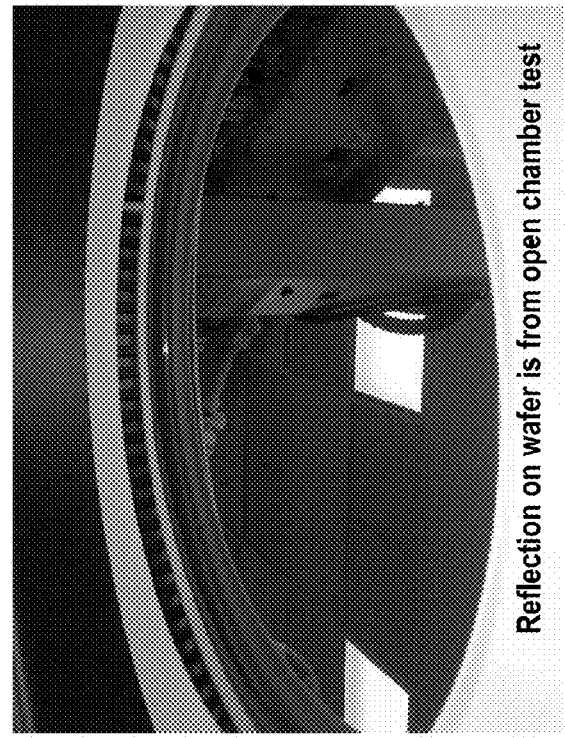
Reflection on wafer is from open chamber test
Figure 3A
Figure 3B
(Camera view from viewport position on the pinnacle identifying emerging pattern)

Exemplary images of emerging pattern captured at different times (At time $t_3$)

(At time $t_4$)

(At time $t_0$)

(At time $t_1$)

(At time $t_2$)

METHODS FOR DETECTING ENDPOINT FOR THROUGH-SILICON VIA REVEAL APPLICATIONS

CLAIM OF PRIORITY

This application claims priority, as a Divisional application, from U.S. patent application Ser. No. 14/265,275, filed on Apr. 29, 2014, entitled "Systems and Methods for Detecting EndPoint for Through Silicon-Via Reveal Applications," which is herein incorporated by reference in its entirety.

BACKGROUND OF THE INVENTION

1. Field of the Invention

The present invention relates generally to optical imaging, and more specifically to endpoint detection in semiconductor manufacturing using pattern recognition technology on the images obtained from optic camera.

2. Description of the Related Art

In the fabrication of semiconductor structures such as integrated circuits, memory cells, and the like, features, structures, and components are defined, patterned, and constructed in a series of manufacturing process steps on semiconductor wafers to create multi-layer integrated structures. During the semiconductor manufacturing process, semiconductor wafers are processed through numerous operations in controlled environments to add layers, and to define, pattern, etch, remove, polish, etc., structures, features and layers. The structures and features formed on the semiconductor wafers are closely monitored and analyzed to precisely determine the endpoint of each process.

One common manufacturing process is plasma etch. In general, during plasma etch, the processing chamber is configured to receive processing gases. The pressure of the process gases within the chamber is controlled in accordance to the requirements of the desired process. Radio frequency (RF) power is applied to one or more electrodes in the processing chamber. Upon applying the desired RF power to the electrode(s), the process gases in the chamber are activated such that a plasma is created. The created plasma is configured to perform the desired etching of the selected layers of a semiconductor wafer. In semiconductor fabrication, plasma etching is commonly used to etch conductive, dielectric and other materials to define features and structures therein or to expose the defined features/structures.

During the etching process, various tools/technologies are used to perform in-situ monitoring and analysis of the conditions within the plasma chamber to determine an endpoint for the etching process, so as to prevent over-etching. One such technology for monitoring uses the optical emission spectroscopy (OES). OES is typically used to detect when a structure or layer is exposed during a plasma etch process. To be effective, the OES detection equipment must be able to resolve a change in emission relative to the background plasma. However, as the features/structures reduce in size, it is becoming increasingly difficult to precisely detect change in emission, especially when the etch process is to have very high selectivity to exposed film around the features/structures.

High selectivity is especially relevant in through-silicon via (TSV) reveal process which performs blanket silicon etch with no stop layer. In the TSV reveal process, TSV nodes are exposed by removing silicon from the backside of the wafer to make contact with the bottom of the TSV nodes defined on the wafer and etch the silicon for a desired height. The etching operation for revealing the TSV nodes have to take into consideration the selectivity of the exposed film, such as liner material around the features/structures, in order to preserve the functionality of the TSV nodes. Due to the high selectivity defined for the etch process, it is very hard to detect when the endpoint for the TSV reveal is reached using the OES technique, as no new species are emitted into the plasma, potentially leading to over-etching of the silicon. The over-etching may result in the TSV nodes protruding too much from the silicon bulk with potential damage to the TSV nodes during packaging.

Another technique that is commonly used is the radio frequency (RF) related endpoint technique. In the RF technique, changes in RF parameters, primarily in the Bias RF delivery, are detected when new films are exposed at endpoint. However, for applications, such as the TSV Reveal, the main etch process does not use Bias Power in order to achieve high selectivity to a film layer formed over the features/structures. As a result, no usable changes in RF parameters can be detected when endpoint is reached.

Another technique that is used in determining end point is the fixed-time approach. This approach makes extensive use of pre-etch and post-etch metrology to control the etch process. The fixed time approach, however, has its own drawbacks as the approach is still vulnerable to process variations, such as drift in the etch rate or variation in the incoming wafer film thickness, etc., leading to unnecessary and excess variation in the desired results, such as large variation in the height of the structures/features.

Each of the above described techniques is well known in the art. The RF technique and the OES signal changes offer extremely low signal to noise ratio and have proven to be inadequate for precisely determining end point for etching processes, especially for the ones that do not use stop film.

In light of the foregoing, what is needed is a system that enables precise prediction of end point, especially for TSV reveal etch process that etches blanket silicon without any stop layer. It is in this context that embodiments of the disclosure arise.

SUMMARY OF THE INVENTION

Broadly speaking, the present invention fills these needs by providing systems for determining endpoint more precisely, for an etching operation. The system includes a camera mounted outside a plasma processing chamber that is configured to take sequential snapshots of the semiconductor wafer surface during the etching operation and transmitting the snapshot images to an image processor unit coupled to the camera. The image processor unit includes a pattern recognition program/logic/algorithm. The pattern recognition program compares the snapshot images against a reference image and determines that an end point has been reached when an image matches a reference image. In some embodiments, data, such as etch-to-depth ratio, etching parameters, etc., may be used to identify the reference image for determining the match. The present invention can be implemented in numerous ways, including as a process, an apparatus, a system, a device, a method, or a computer readable media. Several embodiments of the present invention are described below.

In one embodiment, a plasma processing system for determining endpoint of a plasma etching operation that is being performed on a surface of a wafer, is provided. The wafer has features or structures that have been formed in the silicon layers and the etching operation is to etch some of the silicon layers to reveal the features/structures, such as the through-silicon vias (TSV or pillar structures). The system includes a plasma processing chamber. The plasma processing chamber includes an exterior portion, an interior region and at least one viewport. The interior region is equipped with an electrostatic chuck assembly for receiving the semiconductor wafer. The viewport is disposed on a side wall of the plasma processing chamber and provides visual access from the exterior to the semiconductor wafer when the semiconductor wafer is present on the electrostatic chuck assembly. The camera is mounted to the viewport of the plasma processing chamber on the exterior. The camera is configured to take sequential images of a pattern emerging on the surface of the semiconductor wafer during an etching operation. An image processor is coupled to the camera. The image processor is in communication with a pattern recognition logic to match the images transmitted by the camera at regular intervals to a reference pattern and to generate a signal that identifies an endpoint has been reached and to cause the etch operation to stop, when a match is detected. A host computer is in communication with the image processor and the plasma processing chamber. The host computer is configured to receive the signal from the image processor identifying the endpoint that causes the etching operation to stop.

In one embodiment, a plasma processing system for determining endpoint of a plasma etching operation on a top surface of a semiconductor wafer, is provided. The system includes a plasma processing chamber. The plasma processing chamber includes an exterior, an interior region and at least two viewports. The interior region is equipped with a wafer receiving mechanism for receiving the semiconductor wafer. The viewports are disposed on side walls of the plasma processing chamber and provide visual access from the exterior to the top surface of the semiconductor wafer when the semiconductor wafer is present on the wafer receiving mechanism. A camera is mounted at each of the two viewports of the plasma processing chamber on the exterior. Each of the cameras is configured to take sequential images of a pattern emerging on the portion of the semiconductor wafer during an active etching operation and transmit the captured images. The cameras act as stereo camera and together provide three dimensional view of the emerging pattern during the active etching operation. An external light source is coupled to the camera. The external light source is directed to illuminate the pattern emerging on the semiconductor wafer for capturing of the images by the cameras. A processor is coupled to the cameras and the plasma processing chamber. The processor is in communication with a pattern recognition logic that is configured to detect the emerging pattern from the images captured and transmitted by the cameras at regular intervals, match the emerging pattern to a reference pattern and generate a signal identifying the endpoint to the etch operation when a match is detected.

In yet another embodiment, a method for processing a semiconductor wafer, is disclosed. The method includes receiving the semiconductor wafer on a wafer receiving mechanism provided in an interior region of a plasma processing chamber. An active etch operation is performed on a top surface of the semiconductor wafer received on the wafer receiving mechanism. Sequential images of a pattern emerging on the top surface of the semiconductor wafer are captured during active etch operation, by a camera mounted externally at a viewport defined on a side wall of the plasma processing chamber. The viewport provides visual access to the semiconductor wafer present on the wafer receiving mechanism. The images are captured at an angle defined by the camera mounted at the viewport. The captured images are transmitted at regular intervals. The emerging pattern captured in the images are matched against a reference pattern to determine a match. The reference pattern selected for matching is captured at the angle that matches the angle at which the images are captured. Upon detection of pattern match, a signal is generated causing the etch operation to stop.

The advantages of the present invention over the prior art are numerous. One notable benefit and advantage of the invention is that the camera(s) is able to capture the emerging pattern of infinitesimally small dimensions and match the emerging pattern to a reference pattern captured at the same angle as the angle used to capture the emerging pattern, in a more reliable fashion. The exposed area of the structures/features especially in TSV reveal process is very small, to the order of less than 0.1% of the semiconductor wafer surface and the selectivity to the TSV structures liner material is very high that conventional OES techniques for endpoint detection do not work reliably and consistently. As a result, conventional methods used a timed-etch process. The timed-etch process results in a large variation in the exposed features/structures height. The various embodiments disclosed herein use the pattern recognition technology to more reliably identify the structures when they emerge on the surface of the substrate and enable realization of a controlled endpoint to the etch operation.

Another benefit is the ability to take advantage of the viewports that provide access to the interior of the plasma processing chamber and allows precise detection and matching of the pattern emerging during the active etching operation. In some embodiments, multiple cameras may be used to enhance the pattern matching by allowing the cameras to work in tandem to generate three dimensional view of the emerging pattern. In such embodiments, any skewing of images from one camera may be compensated by the images from another camera. In some embodiments, the image processor may include logic to correct the skew of the received images so that matching may be more precise. In some embodiments, the emerging pattern may be skewed due to the angle at which the cameras capture the pattern appearing on the surface of the semiconductor wafer. In such embodiments, the reference pattern used for matching with the emerging pattern is identified such that the angle at which the reference pattern is captured matches with the angle of capture of the emerging pattern.

Other advantages of the invention will become apparent from the following detailed description, taken in conjunction with the accompanying drawings, illustrating by way of example the principles of the invention.

BRIEF DESCRIPTION OF THE DRAWINGS

The accompanying drawings, which are incorporated in and constitute part of this specification, illustrate exemplary embodiments of the invention and together with the description serve to explain the principles of the invention.

FIGS. 1A-1E illustrate various stages of through silicon via reveal process performed on a semiconductor wafer, in accordance with an embodiment of the present invention.

FIGS. 3A and 3B illustrate image of a wafer displaying wafer surface before endpoint and after endpoint as viewed during an open-chamber test, in accordance to an embodiment of the invention.

DETAILED DESCRIPTION

Figure 1:
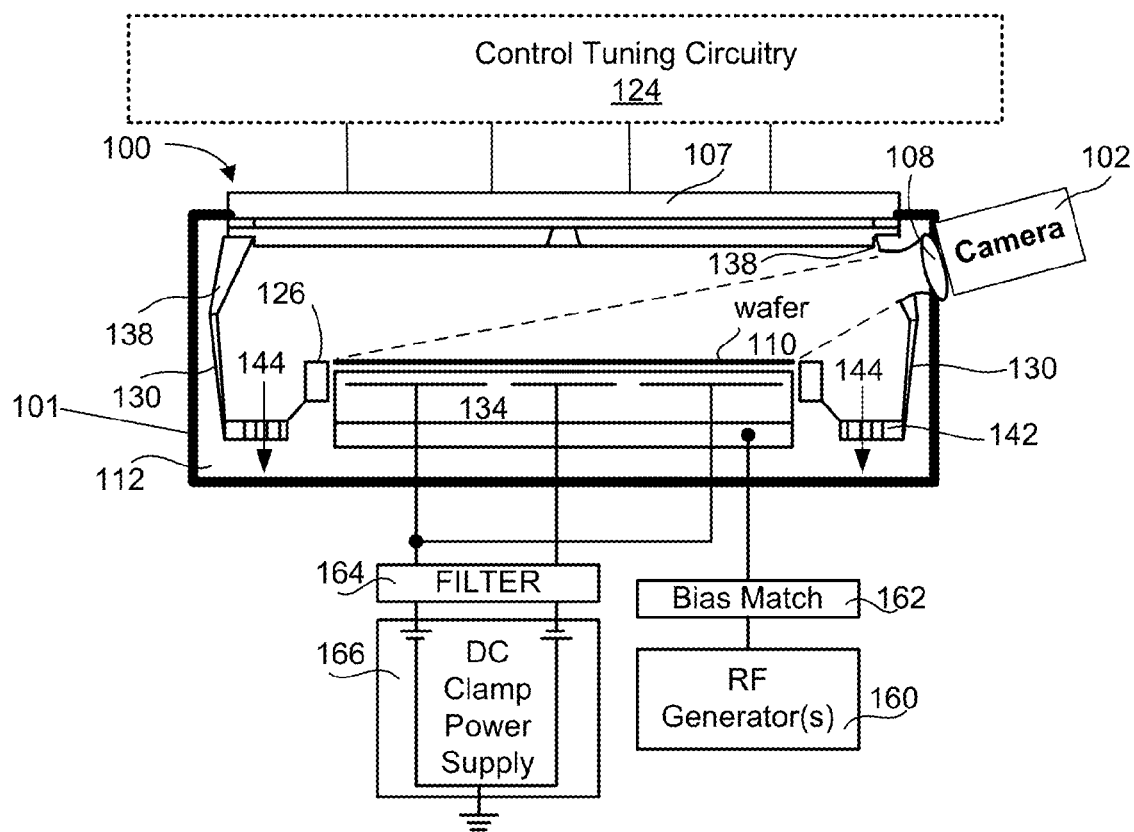
FIG. 1 shows a simple block diagram of a plasma etch system illustrating in-situ monitoring hardware and processes.

An invention for determining process end point in plasma etch operations is described. In preferred embodiments, systems for the detection and analysis of images of emerging pattern include providing a camera at a viewport of a plasma processing chamber, capturing a sequence of images of an active surface of a wafer during an etching operation through the viewport using the camera, comparing the emerging pattern of the captured images with a reference pattern and determining when to generate an endpoint call for the etching operation. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

As an overview, embodiments of the present invention provide ways to determine when an endpoint call is to be initiated for an etching operation that is used to expose features or structures defined on the wafer. The various embodiments are especially effective for an etching application that does not use stop layer, such as a through-silicon via (TSV) reveal process. The TSV reveal process is usually part of a three-dimensional integrated circuit (3DIC) process flow where blanket silicon etch is performed with no stop layer. In a typical TSV reveal process, silicon bulk is etched till copper filled TSV structures/features begin to emerge on the exposed surface of the wafer. These TSV structures become posts or pillars as the silicon etch continues. The goal of TSV reveal process, in one example, is to stop the etching operation when the pillars are approximately 4 micrometer (μm) tall. But the exposed area of the emerging pillars is very low—approximately less than 0.1% of the wafer surface area, and the selectivity to the post material is very high. As a result, conventional Optical Emission Spectroscopy (OES) techniques that are typically used for determining endpoint, do not work. The reason the OES techniques are less effective and does not work is due to the fact that the OES detection equipment must be able to resolve a change in emission relative to the background plasma. However, due to high selectivity of the exposed film material around the copper pillar, no new species are emitted in to the plasma making it very difficult for the OES detection equipment to detect the change in the emission to declare that an endpoint is reached.

To overcome the disadvantages of the OES technique, timed etch processes were relied on to determine the endpoint. However, due to variation in the etch parameters and conditions in the plasma processing chamber, the timed etch processes resulted in large variation in the heights of the emerging pillars.

In order to prevent over-etching and, therefore, overexposing the pillars, current embodiments engage one or more cameras and pattern recognition program to optimally determine when an endpoint for the etching operation is reached. The camera is able to capture the image of emerging pattern of the infinitesimally small structures on the wafer surface. The image is then matched to a reference pattern. When a match is found, an endpoint call is made that causes the etch operation to stop, making this an effective way for determining an endpoint for the etching operation, especially for TSV reveal process that includes infinitesimally small patterns.

FIG. 1 shows a typical plasma processing system illustrating in-situ monitoring hardware and processes, in accordance with one embodiment of the present invention. The plasma processing system includes a plasma processing chamber (or simply a "chamber") 100 having an exterior 101, an interior chamber region 112 that includes a wafer receiving mechanism 134. The wafer receiving mechanism 134 can be an electrostatic chuck for supporting the wafer, when present. As a result, the wafer receiving mechanism 134 is also referred to as a chuck or a bottom electrode. An edge ring or focus ring 126 surrounds chuck 134, and has an upper surface that is approximately planar with a top surface of a wafer, when present over chuck 134. The plasma processing chamber 100 also includes a lower liner 130 that is coupled to an upper liner 138.

The upper liner 138 abuts an upper electrode 107 and may be, in one embodiment, configured to support the upper electrode 107. A tight relationship may be established between the upper electrode and the upper liner 138 by use of O-rings. The upper electrode includes a region (not shown) that will allow process gases to be delivered into processing volume of the plasma processing chamber 100. In one embodiment, the region may include a showerhead to deliver the process gases into the plasma processing chamber 100. The upper electrode may additionally allow other probing apparatus (not shown) to be disposed thereon to allow probing/monitoring of process parameters associated with the plasma processing chamber, during an etching operation. The probing may entail monitoring plasma density measurements, ion density measurements, and other plasma related probing metrics. As illustrated, the upper liner 138 has a tapered structure and is commonly referred to as a "pinnacle." The upper liner 138 is preferably connected to ground, as is chamber 100.

A bias RF generator 160, which can be defined from one or more generators, may be included to provide power to the chuck (i.e., bottom electrode). If multiple generators are provided, different frequencies can be used to achieve various tuning characteristics. When RF generator is provided, a bias match 162 is coupled between the RF generators 160 and a conductive plate of an assembly that defines the chuck 134. The chuck 134 may also include control system, such as electrostatic electrodes, to enable the chucking and de-chucking of the wafer. In one embodiment, a filter 164 and a DC clamp power supply may be provided to enable the chucking and de-chucking of the wafer. The filter and DC clamp power supply is one example of control system that is used for clamping and lifting the wafer off of the chuck 134. Other control systems for clamping and lifting the wafer off of the chuck 134 can also be provided. Although not shown, pumps are connected to the chamber 100 to enable vacuum control and removal of gaseous byproducts from the chamber during operational plasma processing.

A perforated plasma confinement ring 142 is defined at the bottom portion of the lower liner 130 to enable removal of plasma byproducts from the chamber during operation while still confining the plasma over the surface of the substrate (i.e., semiconductor wafer). The flow of the plasma byproducts is illustrated by flow lines 144. Although not illustrated, connections are provided to chamber 100 to remove the byproducts during operation, using a variety of pump configurations, which are well known in the art.

In one embodiment, the upper electrode may be coupled to a control tuning circuitry 124. The control tuning circuitry is used to distribute power and/or control ion density in the plasma based on processing parameters defined for the etching operation being performed on the wafer received on the chuck provided within the chamber. In one embodiment, the control tuning circuitry may be connected to an electronics panel of chamber 100, which, in turn, may be coupled to a system process controller through networking systems. The system process controller may be configured to perform specific processing routines depending on the etching operations desired during specific cycles. The electronics panel, in association with the system process controller can control the supply of processing gases, vacuum, temperature, etc., provided to the chamber 100 during etching operations. Alternately, the electronic panel may be communicatively connected to a host computer through network. The host computer includes a processor that, in association with the electronics panel may control the processing parameters of the plasma within the plasma processing chamber, including starting and stopping the plasma etch operation.

In order to accommodate in-situ process monitoring, the plasma processing chamber 100 can employ various additional features and structures. By way of example, the plasma processing chamber illustrated in FIG. 1 includes a viewport 108 disposed on a side wall of the chamber to provide visual access to a top active surface of the semiconductor wafer received on the chuck 134. In one embodiment, the viewport may be disposed at or just above the upper liner (i.e., the pinnacle) so as to provide an unobstructed visual access to the active surface of the semiconductor wafer disposed on the chuck. In one embodiment, the chamber may be designed with a plurality of viewports around the circumference of the chamber. The thickness and the material of the viewport are defined such that the material is capable of withstanding the conditions of a semiconductor etching chamber while continuing to provide un-obstructed visual access to the wafer received inside the chamber. Typically, chambers operate at elevated temperatures ranging between about 50 Celsius and about 120 Celsius. The temperature will depend on the etching process operation and specific recipe of the process gases. In one embodiment, the chamber 100 will also operate at near vacuum conditions in the range of between about 1 m Torr (mT) and about 100 m Torr (mT). To enable the vacuum conditions, the chamber 100 may be coupled to facilities when installed in a clean room, or a fabrication facility. Facilities include plumbing that provide processing gases, vacuum, temperature control, and environmental particle control. These facilities are coupled to chamber 100 when installed in the target fabrication facility. The chamber 100 may be coupled to a transfer chamber that will enable robotics to transfer semiconductor wafers into and out of chamber 100 using typical automation.

A camera 102 coupled to an image processor unit (not shown), is disposed at the viewport 108 defined in the chamber sidewall. The image processor unit includes a commercially available pattern recognition program for matching a reference pattern to a pattern captured in an image, by the camera. The mounting of the camera is such that it provides an unobstructed visual access to the active surface of the entire wafer or some large subsection thereof. The angle at which the camera is mounted results in the camera capturing images that provide a skewed view of the semiconductor wafer. As a result, the image that is being captured offers a skewed view of the emerging pattern. Consequently, the pattern recognition program identifies a reference pattern that is also captured at the same angle as the image of the emerging pattern so that the matching of the emerging pattern with the identified reference pattern is in accordance to the view angle. The camera may be a fiber optic camera, an infra red camera or any other camera that is capable of capturing sequence of images of the active surface of the semiconductor wafer during an etching operation.

The etching operation conducted within the plasma processing chamber causes silicon material to be etched away to reveal a pattern of features/structures defined on the wafer. The camera is configured to capture the images of the patterns as it emerges on the semiconductor wafer surface during the etching operation. The image processor unit coupled to the camera matches the captured images of the emerging pattern to the reference pattern that was captured at the same angle as the emerging pattern. The reference pattern identifies a target pattern that signals an endpoint has been reached. When the emerging pattern from a captured image matches the retrieved reference pattern, the pattern recognition program declares that an endpoint is reached and initiates an endpoint call.

For example, based on the location and angle of the camera, the images captured by the camera may be skewed. For example, a square or rectangle feature/structure on the active surface may appear to have a rounded contour and the circular semiconductor wafer may appear oval. As a result, the pattern recognition program within the image processor unit matches the emerging patterns with appropriate reference pattern during the matching operation.

The camera 102 is mounted to the viewport 108 using mounting fixture. The camera, in one embodiment, may be mounted at an edge of the chamber below a transformer-coupled plasma (TCP) window, i.e., at a pinnacle defined at the viewport or in-line with gas injection ring of the plasma processing chamber. The camera mounted below the TCP window allows the camera to be able to view the wafer pattern by line of sight. In another embodiment, the camera assembly may be mounted through the TCP window defined above the wafer. For example, the mounting fixture may include a fiber optic cable of the camera that is used to transmit the captured images to the coupled image processor unit. The pattern recognition program of the image processor unit performs the matching of the emerging pattern in the captured images to a reference target pattern in order to establish an endpoint to the etching operation. In another embodiment, a second camera may be disposed at a second viewport defined in the side wall of the plasma processing chamber 100, as will be described in more detail with reference to FIG. 1F. In one embodiment, the second viewport where the second camera is disposed may be identified as the viewport that is diagonally opposite to the viewport 108 at which a first camera 102 is disposed. In this embodiment, the two cameras may act as stereo camera taking images of an emerging pattern on the active surface of the semiconductor wafer during the etching operation and use the captured images to match to a reference pattern. The second camera may be used to compensate for any skew in the structural/featured pattern of the image captured by the first camera. Additionally, the image of the emerging pattern from the stereo camera identifies a three-dimensional attribute. As a result, the matching of the images of the emerging patterns with the reference pattern includes matching to the three-dimensional attributes, as well. In this embodiment, the reference pattern used in determining a match of the emerging patterns is selected to include the three-dimensional attributes at the same angle as that of the images of the emerging patterns.

In one embodiment, reference patterns are defined by first conducting an etching operation on a test wafer and capturing images of the emerging pattern of structures/features on the test wafer surface. The captured images are stored in an image datastore along with the process parameters of the etching chamber at the time the respective images were captured. The process parameters may include the plasma related metrics, camera angle, etc. These images provide the base reference patterns that the image processor unit uses during the matching operation. The images used as the base reference patterns within the datastore may be updated periodically to reflect the changes in the emerging pattern and in the processing parameters. The process flow of determining endpoint using the captured images will be described further with reference to FIGS. 2A-2F.

In one embodiment, a light source for illuminating the pattern emerging on the semiconductor wafer is provided by the plasma generated within the chamber 100. In another embodiment, the light source for illuminating the pattern emerging on the semiconductor wafer within the chamber 100 is provided by an external flash lamp or a continuous external lamp. In this embodiment, the light source is coupled to the camera and the optic cable from the camera may be enhanced to enable transmission of the light pulse from the external lamp into the chamber to illuminate the active surface of the wafer so that the emerging pattern can be captured by the camera in the sequence of images. Thus, the optic cable may be a fiber optic cable that acts as a conduit for the light pulse to shine on the active surface of the wafer and the images captured by the camera are transmitted to the pattern recognition program within the image processor unit.

Figure 1A:
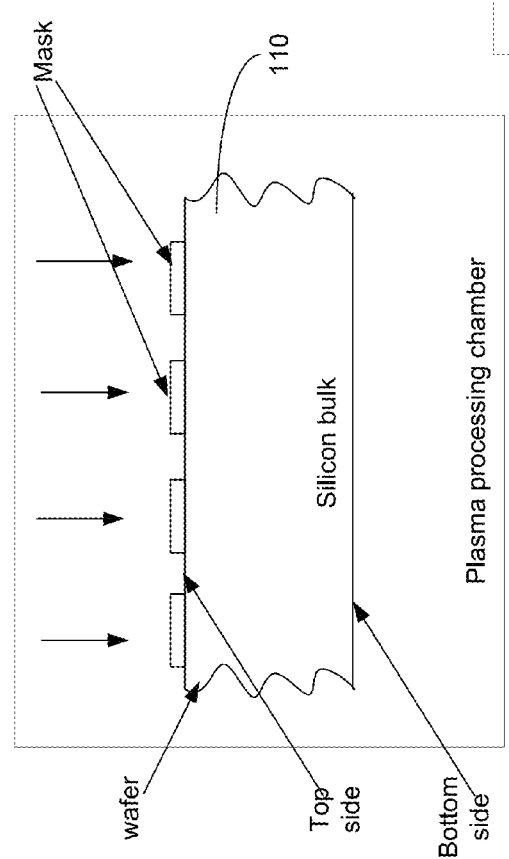
Figure 1B:
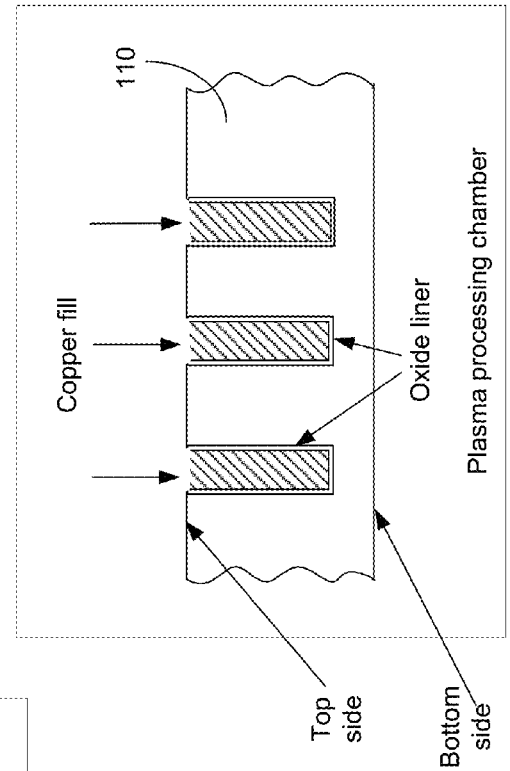

The process of forming the structures/features on the wafer surface will be first described with reference to FIGS. 1A-1F. FIGS. 1A-1F illustrate the process operations involved in preparing a wafer for through-silicon via (TSV) reveal process and performing the TSV reveal process to expose the pillar structures, in one embodiment. Before the wafer undergoes the TSV reveal process, the wafer initially undergoes fabrication operations to define different features/structures that form part of a circuitry, such as logic structure, memory structure, etc., and/or vias for connecting the defined structures with other structures or to the packaging. In one embodiment, a hard mask layer is applied to the active surface (for example, top side) of the wafer, as illustrated in FIG. 1A, and the surface of the wafer is etched to define vias. In one embodiment, the etching is done for about 60-70 micrometers down to define the vias. A layer of oxide liner is formed in the vias and copper is filled in the vias to define the conductive pillar structures/features, as illustrated in FIG. 1B. The surface is then planarized to remove the hard mask layer and any excess copper/oxide deposited at the vias. After formation of the features/structures, in one embodiment, additional circuitry may be defined on the wafer surface, as illustrated in FIG. 1C, using various fabrication operations. For example, a portion of the logic structure, memory structure, etc., may be defined on top of the vias and the vias may act to define interconnection link between the gate and the circuitry defined on the wafer. In another example, a second wafer with defined circuitry of integrated circuit (IC) chip, such as logic structure, memory structure, etc., may be integrated over the vias defined in the semiconductor wafer and the vias act as links to the defined circuitry. In an alternate example, the semiconductor wafer may just include pillar structures defined on the wafer surface and the semiconductor wafer with just the defined pillar structures may act as an interconnection layer connecting circuitry defined on two different integrated circuit chips.

Figure 1E:
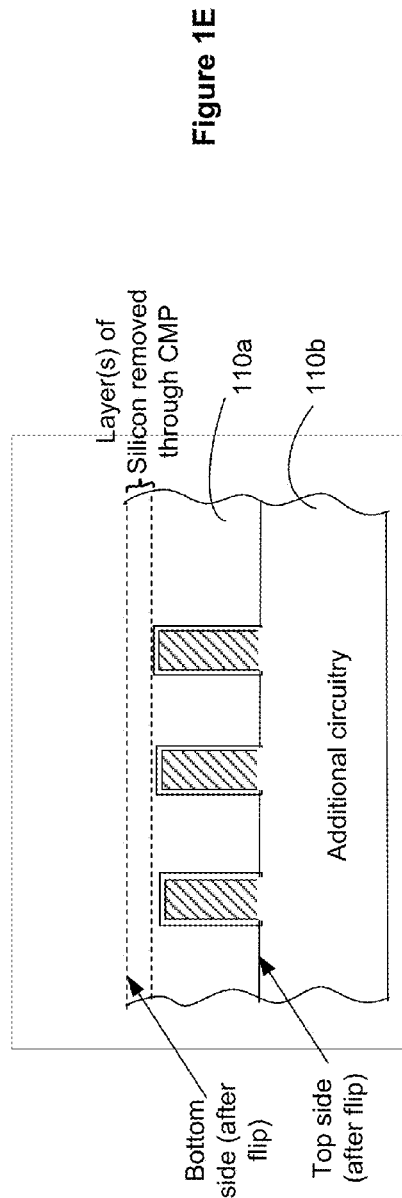

After formation and/or integration of the features/structures/additional circuitry 110b, the wafer 110 is turned upside down, as illustrated in FIG. 1D, coupled to a carrier and subjected to additional fabrication to etch out the layers of silicon from the silicon bulk 110a to expose the underside of the vias defined on the wafer. In one embodiment, the majority of the silicon bulk is removed using a chemical mechanical polishing (CMP), as illustrated in FIG. 1E. In this embodiment, the CMP is used to remove silicon layers from bottom side (i.e., the new top side, when the wafer is flipped upside-down) of the wafer surface up to, for example, about 10 micrometer (micron) depth from the bottom of the vias. Following the CMP process, the wafer is received into the plasma processing chamber and subjected to an etching operation using the etchant gases within the plasma processing chamber. The etching operation is configured to be highly selective to structure liner (for e.g., oxide liner) surrounding the vias so as to avoid etching of the structure liner. In an alternate embodiment, the bulk of the silicon layer of the wafer is removed using the etching operation within the plasma processing chamber. In one embodiment, the etching operation is continued after the patterns have emerged to allow the exposed structures to be exposed as close to a fixed height as possible. For example, the etching operation may continue till the structures emerging on the surface of the wafer are about 4-5 microns in height.

Figure 1F:
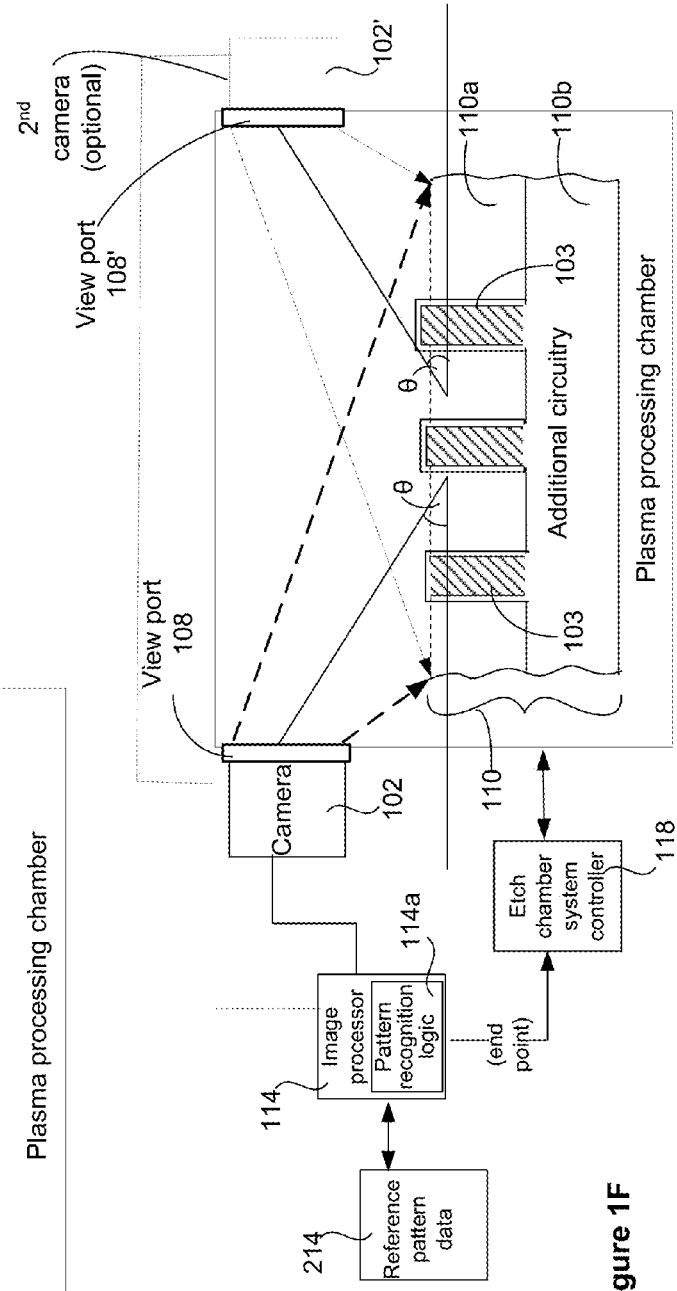
FIG. 1F illustrates the various modules used for detecting endpoint of an etching operation, in accordance to one embodiment of the invention.

The etching operation includes introducing process gases into the chamber and applying the radio frequency power to the process gases so as to generate plasma. As the etching operation progresses, layers from the silicon bulk 110 are etched away from the exposed surface of the wafer revealing an emerging pattern of vias 103. As illustrated in FIG. 1F, images of the emerging pattern are captured by a camera 102 mounted at a viewport 108 defined on a sidewall of the processing chamber. The images are captured at an angle 'Θ' that correlates with the angle at which the camera is mounted. In one embodiment illustrated in FIG. 1F, in addition to camera 102 disposed at viewport 108, a second camera 102' is disposed at a second viewport 108' defined on the sidewall of the processing chamber. The viewport 108' may, in one embodiment, be diagonally opposite to the viewport 108 where the first camera 102 is disposed. Alternately, the viewport 108' at which the second camera 102' is disposed may be defined at any other location on the sidewall of the chamber. The cameras 102 and 102' together act as stereo camera and capture the images of the emerging pattern. The images captured by the cameras identify amount of features emerging, the depth of the features emerging on the exposed surface of the wafer, etc. The captured images are transmitted by the camera(s) to a pattern recognition logic module 114a within an image processor 114 coupled to the camera 102. The pattern recognition module 114a uses the information from the captured images to compensate for any skew and to define three-dimensional attributes of the emerging features. The pattern recognition logic module 114a also identifies a reference pattern 214 and uses data from the reference pattern to match with the attributes of the captured images. The reference pattern data 214 may be stored in a datastore and retrieved by the pattern recognition logic module 114a for matching, in response to receiving the images from the camera. As mentioned earlier, the reference pattern 214 that is identified and retrieved for matching with the emerging patterns are captured at the same angle as the emerging patterns. For example, if a single camera is used, the reference pattern matches is captured at the same angle as the emerging patterns. If two or more cameras are used, then the reference pattern identified is captured using the same number of cameras with each camera matching the angle of the corresponding camera with which the emerging pattern was captured so that the pattern matching is appropriately performed. When a match is found, the pattern recognition module 114a declares that an endpoint is reached and sends out a signal to etch chamber system controller 118 that causes the system controller 118 to stop the etching operation. In one embodiment, the matching may not be exact but may match for at least a pre-defined threshold percent. For example, if the emerging pattern matches to at least 75% of the reference pattern, the pattern recognition module 114a may declare that a match is found and generate the signal to the etch chamber system controller. The etch chamber system controller 118 may adjust controls of the one or more resources in the facilities that are used for providing the plasma within the processing chamber, to suspend the plasma and stop the etching operation. This may entail controlling a gas supply facility, RF power generator, a heater, a cooler, a compressor, etc., to suspend the functional operation so as to stop the etching operation.

Figure 2A:
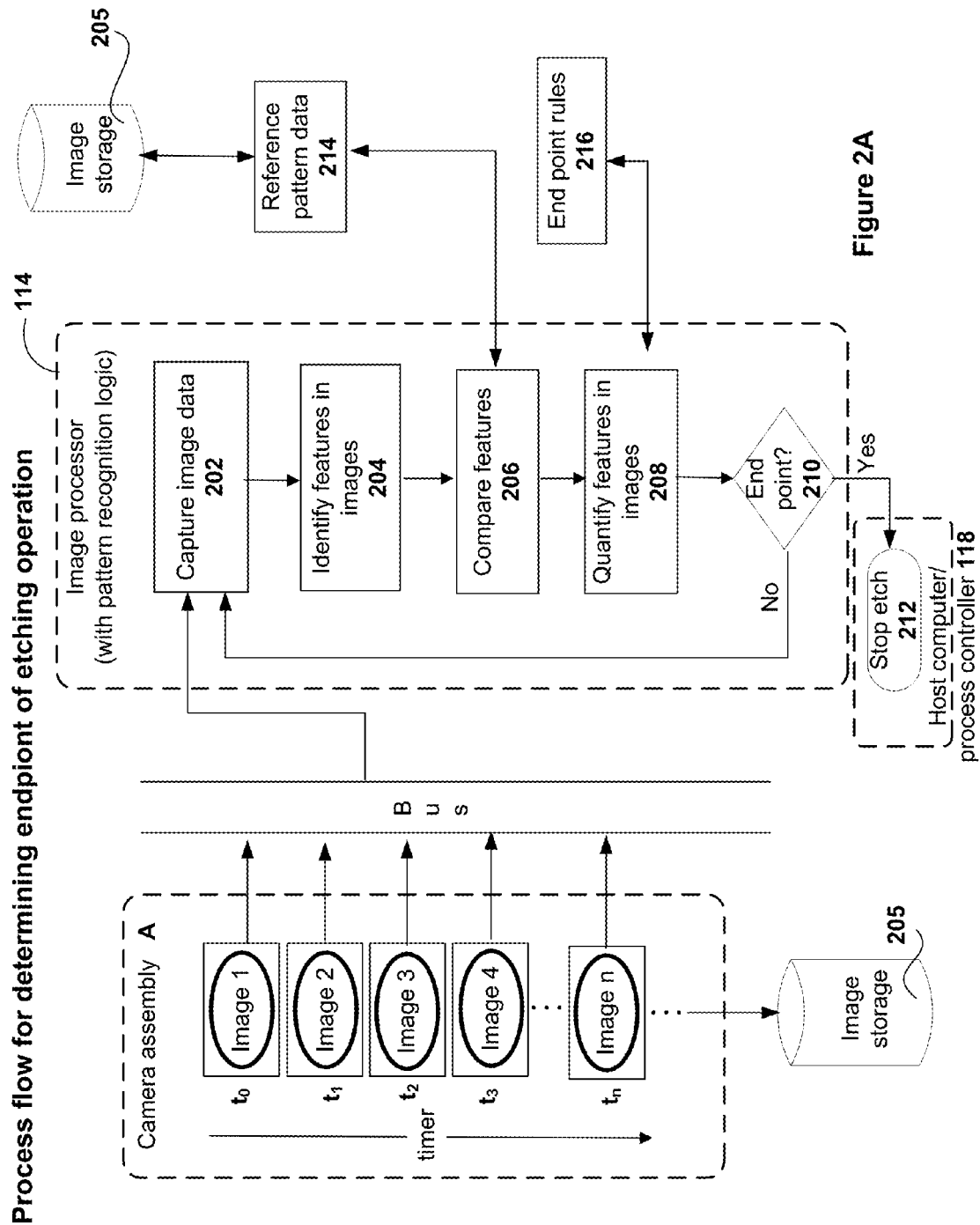
FIG. 2A illustrates the process flow for determining endpoint of an etching operation using a pattern recognition program, in accordance with one embodiment of the invention.
Figure 2B:
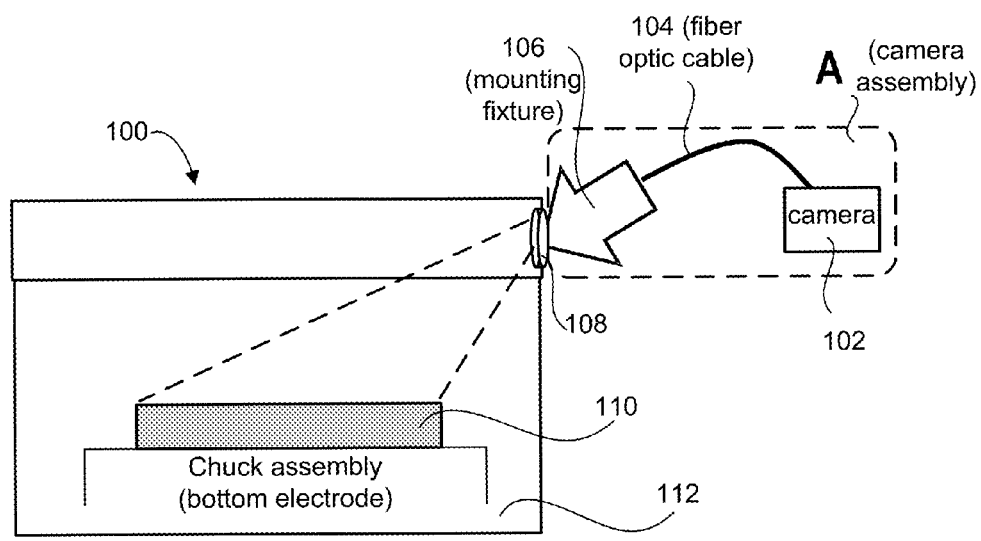
FIGS. 2B-2F illustrate the block diagram of the etching chamber and the various modules used in the different process flow operation defined in FIG. 2A, in accordance with one embodiment of the invention.
Figure 2C:
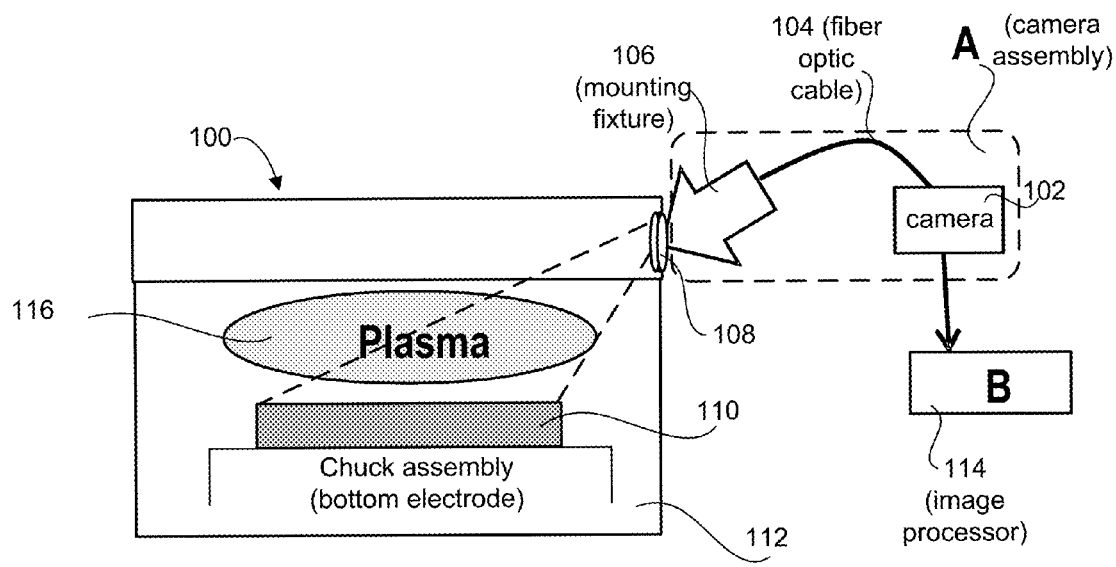

FIG. 2A illustrates a detailed process flow involving the various modules used for determining the endpoint of the etching operation described in FIG. 1F. The etching operation is used for exposing the pillar structures formed in accordance to the embodiments described with reference to FIGS. 1A-1E, in some embodiments of the invention. FIGS. 2B-2F illustrate the various modules of the plasma processing system engaged during the various operations. Referring simultaneously to FIGS. 2A and 2B-2F, a wafer is received on a chuck disposed within the plasma processing chamber, for undergoing an etching operation to expose the structures defined therein. Image data of an active surface of the wafer is captured (step 202) by a camera 102 of camera assembly A during an etching operation. The camera is mounted on the outside of the processing chamber at a viewport defined on a sidewall, using a camera assembly 'A', as illustrated in FIGS. 2B and 2C. The viewport is, in one embodiment, located at or just above a pinnacle (138 of FIG. 1) defined in an upper liner within the chamber. As illustrated in FIGS. 2B and 2C, the camera assembly A includes the camera 102, a fiber optic cable 104 for transmitting images captured by the camera, and an image processing module (B) that includes the image processor 114. The camera assembly includes mounting fixtures to mount the camera on the outside of the chamber at a location defined by arrow 106 that corresponds to the location where a viewport 108 is disposed so that the camera has the active surface of the wafer within its line-of-sight.

Figure 2D:
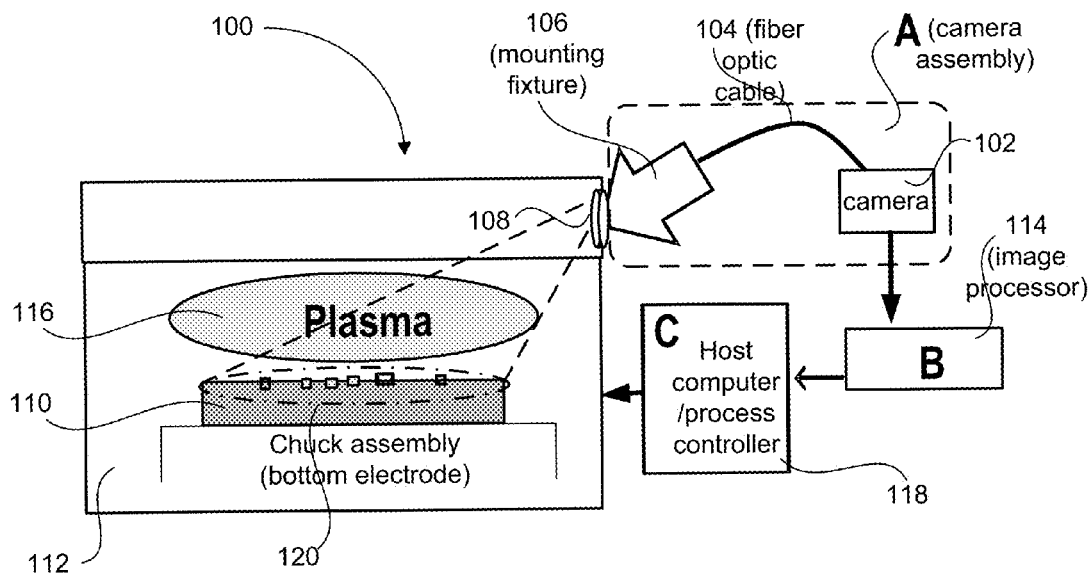
Figure 2E:
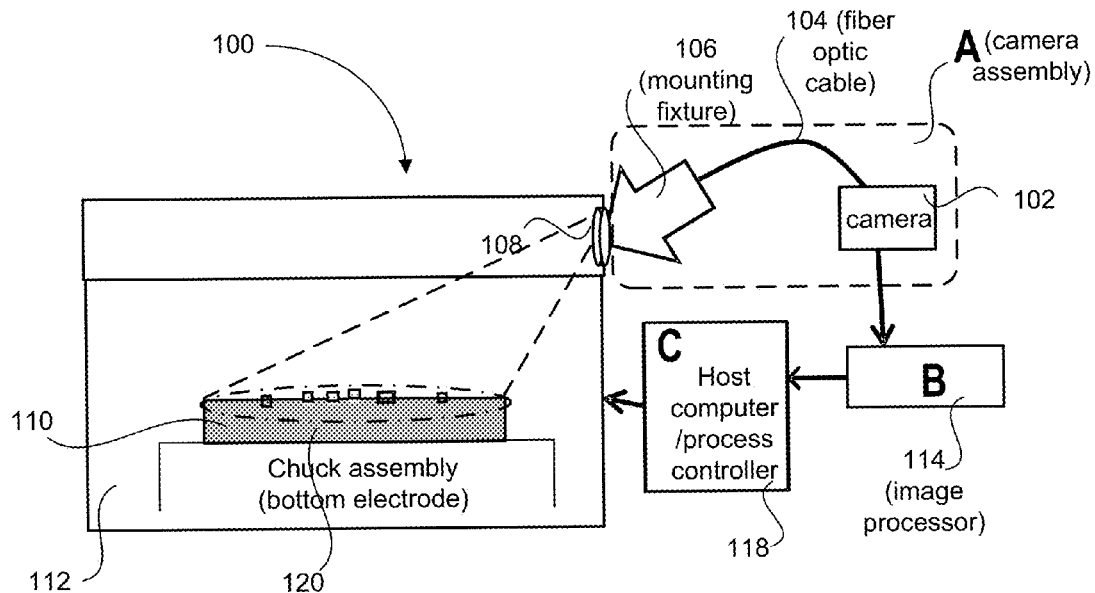

A series of images (images 1, 2, 3, 4, . . . n) of a pattern of structures 120 emerging over time (time interval $t_0$, $t_1$, $t_2$, $t_3$, . . . $t_n$), are captured by the camera 102 and sent to an image processor unit (B) 114 at regular intervals. FIG. 2D illustrates a pattern emerging on the active surface of the wafer as captured by the camera 102. The images are transmitted through a fiber optic cable 104, for example, through a data bus to the image processor unit 114 coupled to the camera. It should be noted that, although the various embodiments have been described with reference to usage of fiber optic cable for transmitting the images from the camera to the image processor unit 114, it should be understood that usage of fiber optic cable is exemplary and should not be considered restrictive. Other types of cable that are configured to transmit images, may also be used. In one embodiment, the regular interval may be defined as about 0.1 sec or about 1 sec. The defined interval is exemplary and may be adjusted based on the type of feature emerging and requirement for determining endpoint.

As and when the captured images are transmitted, the image processor unit 114 identifies pattern of features/structures in the images (step 204). Identifying pattern may include identifying the features/structures that have emerged, height/depth of the emerged features/structures, etc. The image processor unit retrieves reference pattern from a reference pattern datastore 214, determines the features of the reference pattern and compares the features/structures that have been exposed in the reference pattern with the identified features of the emerging pattern captured in each image (step 206). The reference pattern that is retrieved is identified by comparing the image attributes, such as camera angle at which the image was captured, type of structure/feature exposed, processing attributes used for exposing the features/structures, etc. The image processor unit 114 includes a pattern recognition program that receives the captured images, analyzes the captured images by quantifying the features of the emerging structures (step 208), such as type of feature/structure being exposed, height, time when the structures emerged on the surface, number of structures that have emerged, etc., and compares the features of the emerging pattern to the features of a reference pattern to determine if an acceptable endpoint has been reached. In one embodiment, the image processor unit 114 may retrieve certain threshold values related to the features from an end point rules 216 (step 208) when trying to match the pattern captured in the sequence of images to the reference pattern in order to determine if the endpoint has been reached. The end point rules may specify a minimum amount of features that have to be matched in order to declare a pattern match. For example, the rules may specify that at least 70% of the structures that have emerged have to match with the reference pattern in order to call a match. The end point rules may specify threshold value for each type of feature/structure that is defined on the surface of the wafer. Based on the rules, the image processor unit 114 may determine if a match has been found for the reference pattern in the images (step 210). If a match has been found, the image processor unit will declare that the endpoint has been reached and send a signal to the system processor of a host computer or a process controller 118 that the end point has been reached (step 212). If no match has been found, the image processor unit 114 will return to step 202 to scan the next image and repeat the process of finding a match. In one embodiment, the process controller may be part of the electronic control tuning circuitry of the electronics panel of the chamber 100. Alternately, the process controller may be part of a host computer system that is in communication with the control tuning circuitry of the electronics panel of the chamber through network.

Figure 2F:
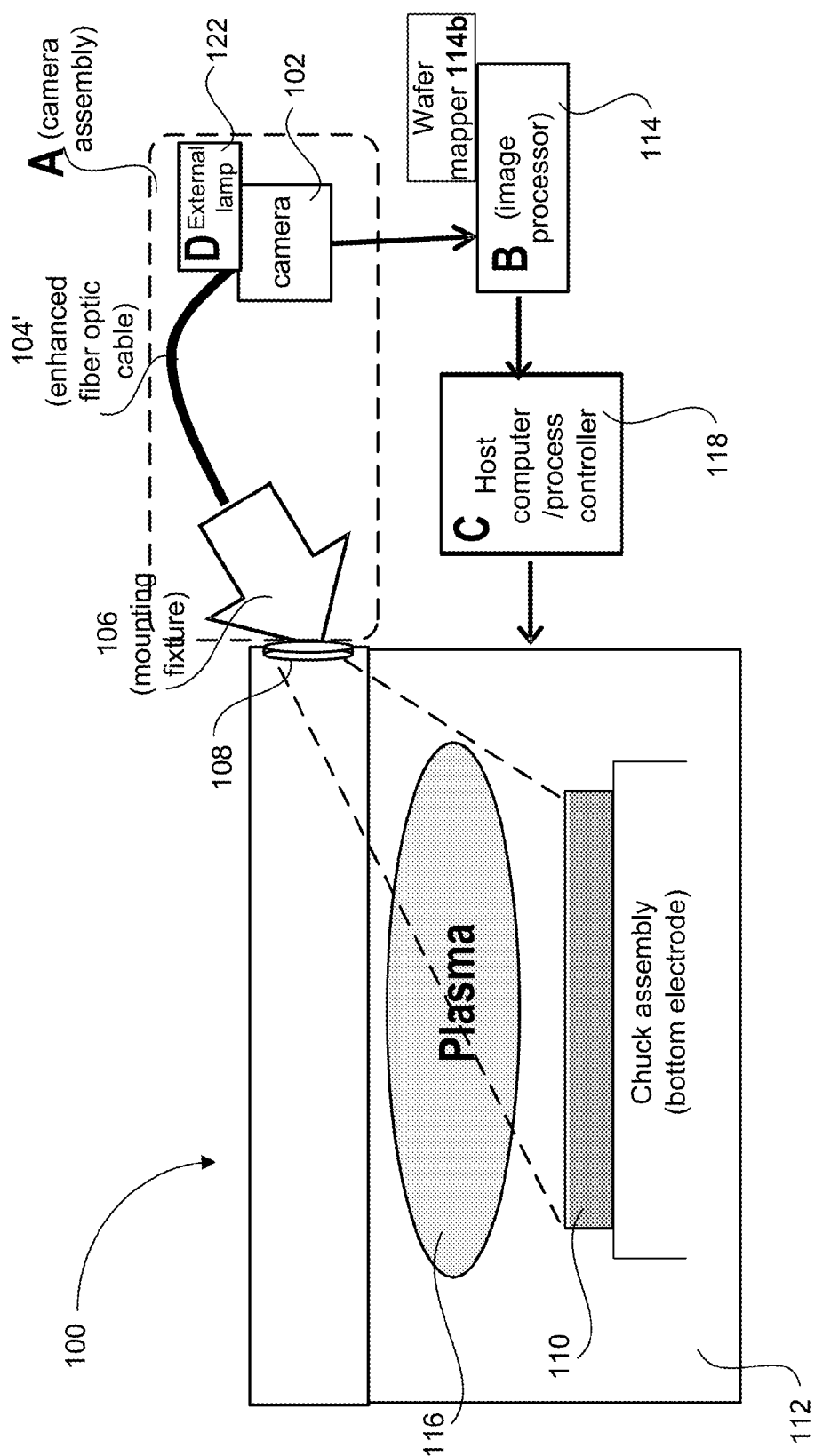

In one embodiment, light for capturing the images of emerging pattern is provided by the plasma 116 generated within the plasma processing chamber during the etching operation. In one embodiment, in addition to the light provided by the plasma 116, an external light source may be used to provide the light for the images. FIG. 2F illustrates the embodiment wherein an external lamp is used to provide light source to the camera during the capturing of the images. In this embodiment, a flash lamp D 122 is added to the camera mount assembly coupling the flash lamp D to the camera 102. The cable E 104' of the camera is an enhanced cable that allows passage of light pulse from the flash lamp D toward the active surface of the wafer to illuminate the emerging patterns captured in the images, as well as transmission of the captured images to the image processor unit so as to match to a reference pattern. It should be noted that the emerging pattern is of the structures/features, such as vias or pillars, defined on the wafer surface that are being exposed by the etching operation.

Continuing to refer to FIG. 2F, in one embodiment, during the analysis of the patterns, the pattern recognition program may detect a profile of the emerging pattern at a particular time to intelligently predict when the specific pattern matching the reference pattern may emerge on the wafer surface. In one embodiment, a wafer mapper software 114b coupled to the image processor unit 114 may be used to intelligently predict the likelihood of when a specific pattern may emerge on the wafer surface. The wafer mapper software may be supplied with the images, the type of feature being exposed, the detected profile of the emerging pattern, and the current etching parameters within the processing chamber, such as etch rate, etc., by the pattern recognition program. The built-in logic within the wafer mapper software uses the information provided to predict what patterns would emerge from the etching operation at different times.

In one embodiment, depending on the intelligent prediction, the etching operation may switch from pattern matching technique to a time-based etching technique to define the endpoint for the etching operation. In one embodiment, the profile of the emerging pattern may be used to not only intelligently predict when a desired pattern is likely to emerge but also to control the etching operation within the chamber. The etching operation may be controlled by controlling the one or more resources that are used in the etching operation, such as a facility that supplies plasma gas, RF power generator, a heater, a cooler, a compressor, etc. Using the pattern prediction from the wafer mapper, controls of one or more resources may be fine-tuned to enable improvement in the emergence of patterns on the wafer surface during subsequent etching operation so that the pattern emergence is more even across the surface of the wafer.

In one embodiment, quantifying the patterns includes computing heights of the different pillars, based on when each of the pillars began to emerge on the wafer surface and the etching parameters used during the etching operation. The computed heights may be adjusted by taking into consideration the shadows of the pillars, etc., captured in the respective images, during image processing. The height information may be used during matching of the emerging pattern with the reference pattern. The reference pattern for image processing may be obtained, in one embodiment, by first conducting an etching operation on a test wafer with a set of etching parameters. Images are captured for the patterns emerging on the wafer surface at different times. Each of the captured image identify what the image is going to look like for these parameters at specific time, including height of each structure within an emerging pattern captured in the images, and save the image data in a library, such as image storage 205 of FIG. 2A, as reference pattern data. The mapping of the images for a wafer during subsequent etching operations may be performed by mapping the image data in the library (i.e., image storage database 205) to the appropriate captured reference data.

When the image processor unit detects a matching of a pattern 120 captured in an image by the camera, as illustrated in FIG. 2D, the image processor unit 114 sends a signal to a control processing unit of a host computer 'C' 118, for example, coupled to the image processor unit 114 to indicate that a match is found and to terminate the etching operation as an endpoint has been reached. In one embodiment, the image processor unit 114 may be integrated with the control processing unit of the host computer 118.

The control processing unit within the host computer C 118 receives the signal, and adjusts one or more controls within an electronic panel used for managing the resources that are used to provide the plasma within the chamber, to terminate the etching operation. The adjustment of the controls by the control processing unit may include adjusting the controls of the RF generator to suspend the RF power provided to generate plasma, adjusting the controls of a gas supply to stop the flow of process gases into the chamber, etc., thereby suspending the etching operation, as illustrated by the absence of plasma in FIG. 2E.

In one embodiment, as the etching operation progresses, the features and structures are exposed at varying times and at varying degrees. This may be due to the varying processing conditions within the chamber, such as varying distribution of ions in the plasma, for example. The pattern recognition program takes into consideration such variances in the processing conditions within the chamber, during the matching of the emerging pattern with the reference pattern.

FIGS. 3A-3B illustrate images of a wafer surface at the beginning of an etching operation to determine endpoint and after the endpoint has been reached. FIG. 3A illustrates an image that captures a reflection of the wafer surface from an open-chamber test. As shown, the image does not show any discernible pattern emerging from the wafer surface. FIG. 3B illustrates the image capturing a reflection of the wafer surface after an endpoint is reached. As shown, the image clearly identifies an emerging pattern of structures that was exposed by the etching operation. The camera view mounted at the viewport defined at the pinnacle is trained to recognize this emerging pattern, which is then used to match with reference pattern to define endpoint.

Figure 4:
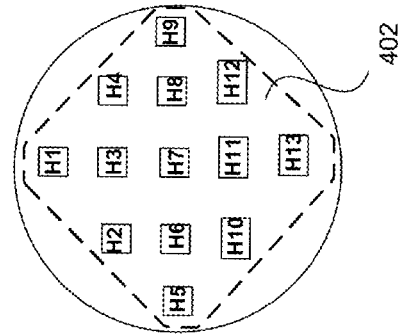
FIG. 4 illustrates a reference pattern used for matching with the actual images of emerging pattern on a wafer.
Figure 4D:
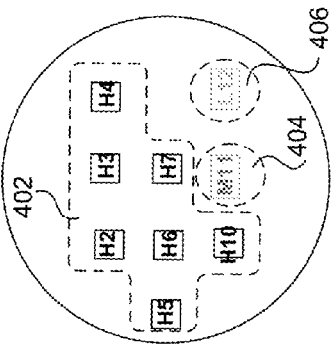
FIGS. 4A-4E illustrate the actual images of emerging pattern on a wafer surface captured at different times during an etching operation in accordance with one embodiment of the present invention.
Figure 4E:
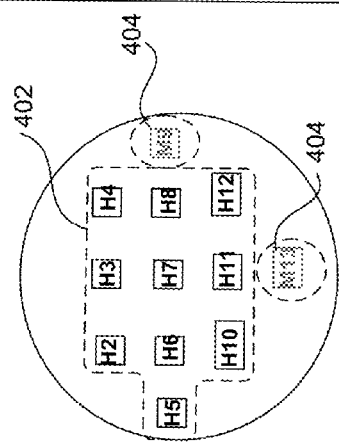
Figure 4A:
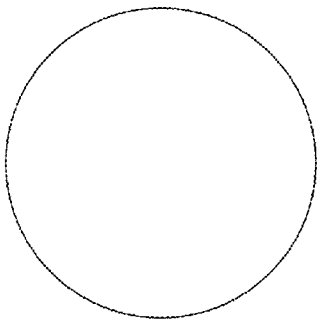
Figure 4B:
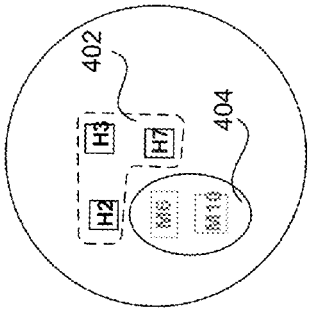
Figure 4C:
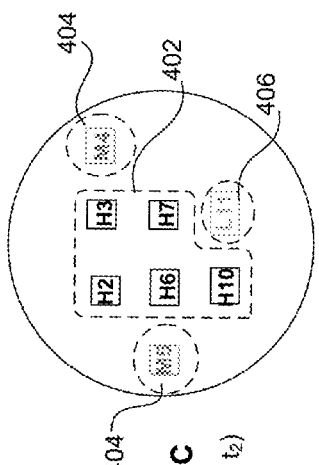

FIGS. 4, 4A-4E illustrate the emerging pattern at different time periods and an expected pattern that is used to detect the endpoint for the etching operation. FIG. 4 illustrates an exemplary reference pattern that is used for matching emerging patterns in order to determine if an endpoint is reached. As illustrated, the pattern includes the emerging structures/features H1-H13 and the pattern of distribution of the features/structures. During the etching operation, layers of silicon are etched away to start revealing emerging pattern of features/structures defined in the wafer. For example, as illustrated in FIG. 4A, at time t0 when the etching operation has just begin, the wafer surface does not include any visible pattern, as represented by the blank wafer surface. As the etching operation progresses, a pattern of structures begins to emerge, as illustrated in FIG. 4B at time t1. The pattern includes structures/features H2, H3 and H7 (represented by 402) that have fully emerged to at least a specific height (indicating "high" height features), features M6 and M10 (represented by 404) that have emerged to a minimum height (indicating "medium" height features). As the etching operation continues further, additional structures/features begin to emerge. As a result, the emerging pattern at time t2 illustrated in FIG. 4C includes structures/features H2, H3, H6-H7 and H10 (represented by 402) that have emerged to at least the specific height (indicating high height features), M5 and M4 (represented by 404) that have emerged to the minimum height (indicating medium height features) and L11 (represented by 406) that has barely broken the surface of the wafer (indicating low height features). It should be noted that the features that are designated as high height, may not all be at the same height. Instead these features may be of varying heights with each feature designated as high height being at least at the specific height. Similarly, the features designated as medium height may be of varying heights with each feature in this designation being at least at the minimum height with some of the features with this designation being between the minimum height and the specific height. Lastly, the features designated as low height may be just breaking the surface of the wafer and are less than the minimum height.

Continuing with reference to FIGS. 4A-4E, at time t3 illustrated in FIG. 4D the emerging pattern includes structures/features H2-H7, H10 (represented by 402) at least at the specific height, feature M11 (represented by 404) at least at the minimum height and L12 (represented by 406) at less than the minimum height. At time t4 illustrated in FIG. 4E the emerging pattern includes structures/features H2-H8, H10-H12 (represented by 402) at least at the specific height, M9 and M13 (represented by 404) at least at the minimum height. With the passage of time and continued etching, the features that were exposed initially will begin to be over-exposed and have greater height while the features that emerged later will have a relatively smaller height and features that were hidden will remain unexposed. In order to preserve the integrity of the features/structures exposed on the wafer surface and the desire to expose as many structures as possible, care should be taken to not over-expose the structures. As a result, the image processor unit may rely on end point rules to determine when to declare endpoint for the etching operation. In the embodiments illustrated in FIGS. 4A-4E, the image processor unit may declare that an end point has been reached when the pattern illustrated in FIG. 4E is matched with the reference pattern, based on the end point rules. In one embodiment, the end point rules may specify how many of the high height features, how many of the medium height features and how many of the low height features have to be matched before calling the emerging pattern as matched with the reference pattern. Other varying degrees of pattern matching may be adopted based on the type of feature being exposed and the etching parameters defined for generating the plasma in the plasma chamber.

In one embodiment, the reference pattern used for pattern matching is a baseline reference pattern data identified for the wafer. Based on yield, the baseline pattern may be revised over time and stored as a revised set of reference pattern data. The stored reference patterns are used in the comparison of features/structures to determine endpoint based on the actual etch yield and a desired etch yield.

Figure 5:
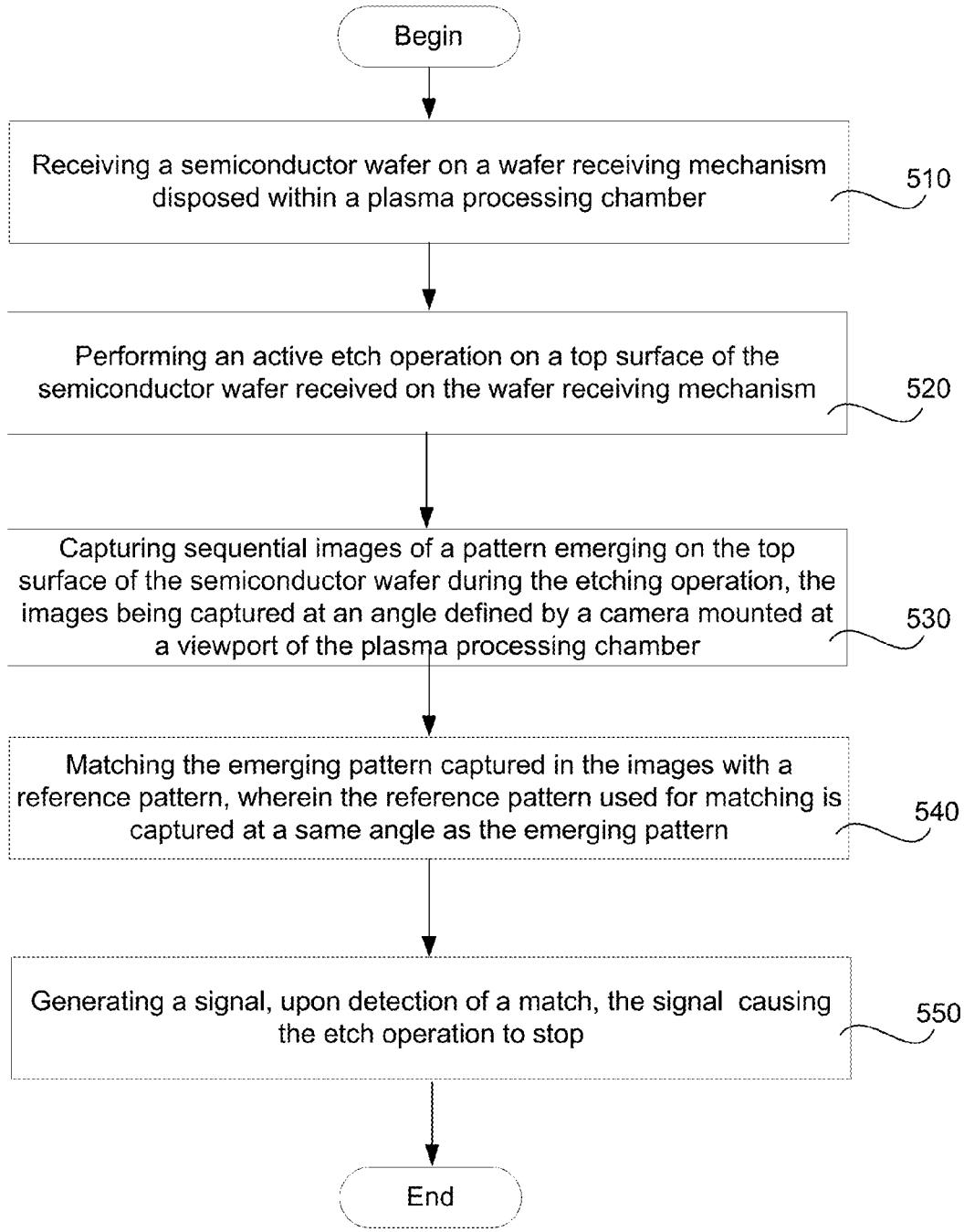
FIG. 5 illustrates various operations of a method for processing a substrate, in accordance with an embodiment of the present invention.

With the above detailed description of the various embodiments, a method for processing a semiconductor wafer will now be described with reference to FIG. 5. The method begins at operation 510, when a semiconductor wafer is received on a wafer receiving mechanism provided in an interior of a plasma processing chamber. The wafer receiving mechanism may be a chuck assembly. An active etch operation is performed on the top surface of the wafer received within the plasma processing chamber, as illustrated in operation 520. Sequential images of a pattern emerging on the top surface of the semiconductor wafer during the active etch operation, are captured, as illustrated in operation 530. The images are captured by a camera that is mounted externally at a viewport defined on a side wall of the plasma processing chamber. The camera may, in one embodiment, be mounted at the pinnacle defined in an upper liner of the processing chamber such that the camera has an unobstructed view of the wafer when it is present on the wafer receiving mechanism. The images may be skewed due to the angle of mount of the camera.

The images of the emerging pattern are matched with a reference pattern, as illustrated in operation 540. The reference pattern is identified based on image attributes of the captured image and based on the features/structures that are being exposed on the wafer surface. The reference pattern may be identified by an image processor module such that the image in the reference pattern are captured at the same angle as the emerging pattern that is being matched.

When a match is detected for an emerging pattern, a signal is generated by the image processor to cause the etching operation to stop, as illustrated in operation 550. The signal may be transmitted to a system controller or a host computer with a built-in system process controller or in communication with a system process controller. The system controller is configured to adjust controls of one or more process resources that are used in the etching operation, to stop the etching operation. As described earlier, the controls of a RF generator may be adjusted to stop the RF power used for generating plasma, the controls of a gas supply may be adjusted to stop the flow of process gas into the chamber, etc., so as to stop the etching operation.

The various embodiments described herein provide a more efficient way of initiating a controlled endpoint call for an etch operation by using pattern recognition technology to identify pillars or structures when they emerge on the wafer surface. The pattern recognition process is much more efficient for TSV reveal process, especially for detecting infinitesimally small structures emerging on the wafer surface during plasma etch process as opposed to OES technology or time-based technology. The small structures occupy low surface area of the wafer and are especially hard to detect using the OES technology. The OES technology has to resolve a change in emission relative to the background plasma. Due to high selectivity of the plasma etch process to the film around the exposed structures, such as copper pillars, no new species are emitted in the plasma when endpoint is reached making it hard for even the most precise OES equipment to detect change in emission, and, consequently, the endpoint for the etching application. Whereas the various embodiments provide a more precise way of detecting the endpoint.

The various embodiments described herein are not restricted to detecting endpoint for the pillar structures in the TSV reveal process but can be extended to any other process, such as dual damascene process used for defining patterns that would require etching to reveal structures formed on the wafer surface and to determine endpoint of the etching operation based on the exposed structures.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Aspects of the invention can also be embodied as computer readable code on computer readable media. Computer readable media is any data storage device that can store data which can be thereafter read by a computer system. Computer readable media also includes an electromagnetic carrier wave in which the computer code is embodied. Examples of computer readable media include hard drives, network attached storage (NAS), read-only memory, random-access memory, CD-ROMs, CD-Rs, CD-RWs, magnetic tapes, and other optical and non-optical data storage devices. Computer readable media can also be distributed over a network coupled computer system so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for processing a semiconductor wafer, comprising:
   detecting the semiconductor wafer received on a wafer receiving mechanism disposed inside a plasma processing chamber;
   performing an active etch operation on a top surface of the semiconductor wafer received on the wafer receiving mechanism;
   activating a first camera to capture a first set of sequential images of a pattern of conductive features emerging on the top surface of the semiconductor wafer during the active etch operation, the first set of sequential images being captured at an angle that corresponds with an angle at which the first camera is mounted externally at a first viewport defined on a side wall of the plasma processing chamber and oriented below a first transformer-coupled plasma (TCP) window defined on the side wall, wherein the first TCP window is oriented above a top surface of the wafer receiving mechanism, the angle of mount of the first camera providing a side view of the pattern of conductive features emerging during the active etch operation;
   transmitting the captured first set of sequential images at regular intervals to an image processor coupled to the first camera, for matching the emerging pattern captured in the first set of sequential images with a reference pattern, wherein the reference pattern used for matching is captured at the angle that matches with the angle at which the first set of sequential images of the emerging pattern are captured; and
   generating a signal to suspend the active etch operation, upon detection of a match,
   wherein operations of the method are performed by a processor of a host computer.

2. The method of claim 1, further includes activating an external light source that is coupled to the camera, the external light source used to illuminate the pattern emerging on the semiconductor wafer.

3. The method of claim 1, wherein the regular intervals for transmitting the first set of sequential images is programmable based on type of feature being defined by the active etch operation.

4. The method of claim 1, wherein matching the emerging pattern further includes identifying number of features and a height of each feature emerging on the top surface of the semiconductor wafer during the active etch operation, wherein the number of features and the height of the respective features are based on amount of exposure to etchant chemistry.

5. The method of claim 1, wherein matching the emerging pattern further includes,
   determining features and height of each of the features in the emerging pattern captured in an image of the first set of sequential images;
   matching the features and the height of each of the features with corresponding features in the reference pattern; and
   declaring a match is found when the features and the height of the features in the emerging pattern match with corresponding features in the reference pattern is above a threshold percent.

6. The method of claim 1, further includes activating a second camera mounted at a second viewport defined on the side wall to capture a second set of sequential images of the pattern emerging on the top surface of the semiconductor wafer, the second set of sequential images capturing a different view angle of the pattern, the second set of sequential images from the second camera together with the first set of sequential images from the first camera are used to determine a three-dimensional attribute of the emerging pattern.

7. The method of claim 6, wherein the matching includes matching the three-dimensional attribute of the emerging pattern captured in the first set and second set of sequential images by the first camera and the second camera with corresponding three-dimensional attributes of the reference pattern.

8. The method of claim 1, further includes adjusting one or more etching parameters to control suspension of the active etch operation performed within the plasma processing chamber, in response to the signal.

9. A method for processing a semiconductor wafer, comprising:
   detecting the semiconductor wafer received on a wafer receiving mechanism disposed inside a plasma processing chamber;
   performing an active etch operation on a top surface of the semiconductor wafer received on the wafer receiving mechanism;
   activating a first camera to capture a first set of sequential images of a pattern emerging on the top surface of the semiconductor wafer during the active etch operation, the captured first set of sequential images being transmitted at regular intervals during the active etch operation;
   activating a second camera to capture a second set of sequential images of the pattern during the active etch operation, the captured second set of sequential images being transmitted at regular intervals during the active etch operation;

activating a first external light source coupled to the first camera;

activating a second external light source coupled to the second camera, wherein a light pulse from each of the first and the second light sources illuminates the pattern emerging on the top surface of the semiconductor wafer to enable the first and the second cameras to capture the emerging pattern;

matching the emerging pattern captured in the first and the second set of sequential images with a reference pattern; and generating a signal to suspend the active etch operation, upon detection of a match, wherein operations of the method are performed by a processor of a host computer.

10. The method of claim 9, wherein the first set of sequential images are captured at a first angle that corresponds with an angle at which the first camera is mounted externally at a first viewport defined on a side wall of the plasma processing chamber, wherein the second set of sequential images are captured at a second angle that corresponds with an angle at which the second camera is mounted externally at a second viewport defined on the side wall of the plasma processing chamber.

11. The method of claim 10, wherein the first viewport is defined substantially opposite to the second viewport.

12. The method of claim 9, wherein the reference pattern used for matching includes patterns captured at angles that match with the first angle at which the first set of sequential images and the second angle at which the second set of sequential images are captured.

13. The method of claim 9, wherein the first set of sequential images and the second set of sequential images are used to define a three-dimensional attribute of the emerging pattern, and wherein the matching of the emerging pattern includes matching the three-dimensional attribute of the emerging pattern with a corresponding three-dimensional attribute of the reference pattern.

14. The method of claim 9, wherein the regular intervals for transmitting the sequential images is programmable based on type of feature being defined by the active etch operation.

15. The method of claim 9, wherein matching the emerging pattern further includes, determining number of features and a height of each feature emerging on the top surface of the semiconductor wafer during the active etch operation; and matching the number of features and the height of each feature of the emerging pattern with corresponding features in the reference pattern; and declaring a match is found when the number of features and the height of each of the features in the emerging pattern that match with corresponding features in the reference pattern is above a threshold percent.

16. The method of claim 9, further includes adjusting one or more etching parameters to control suspension of the active etch operation performed within the plasma processing chamber, in response to the signal.

* * * * *